(12) United States Patent  
Iza et al.

(10) Patent No.: US 7,709,284 B2
(45) Date of Patent: May 4, 2010

(54) METHOD FOR DEPOSITION OF MAGNESIUM DOPED (AL, IN, GA, B)N LAYERS

(75) Inventors: Michael Iza, Santa Barbara, CA (US); Hitoshi Sato, Santa Barbara, CA (US); Steven P. DenBaars, Goleta, CA (US); Shuji Nakamura, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 11/840,057

(22) Filed: Aug. 16, 2007

(65) Prior Publication Data

US 2008/0042121 A1 Feb. 21, 2008

Related U.S. Application Data

(60) Provisional application No. 60/822,600, filed on Aug. 16, 2006.

(51) Int. Cl.
*H01L 21/00* (2006.01)
*H01L 33/00* (2010.01)

(52) U.S. Cl. .............................. 438/46; 438/47; 257/76; 257/94

(58) Field of Classification Search .................... 438/45, 438/46, 47; 257/76, 94, 98
See application file for complete search history.

(56) References Cited

U.S. PATENT DOCUMENTS

| | | |
|---|---|---|
| 5,306,662 A | 4/1994 | Nakamura |
| 6,316,785 B1 | 11/2001 | Nunoue et al. |
| 6,649,287 B2 * | 11/2003 | Weeks et al. ................. 428/698 |
| 6,815,730 B2 * | 11/2004 | Yamada ....................... 257/101 |
| 7,078,735 B2 * | 7/2006 | Shono et al. .................. 257/98 |
| 2002/0144645 A1 | 10/2002 | Kim et al. |
| 2003/0024475 A1 | 2/2003 | Anderson |
| 2004/0188689 A1 | 9/2004 | Shono et al. |
| 2005/0142391 A1 | 6/2005 | Dmitriev et al. |
| 2005/0161697 A1 | 7/2005 | Nakahata et al. |
| 2005/0258451 A1 | 11/2005 | Saxler et al. |
| 2006/0192195 A1 * | 8/2006 | Lee ............................ 257/14 |

OTHER PUBLICATIONS

H. Amano et al., Metalorganic Vapor Phase Epitaxial Growth of a High Quality GaN Film Using an AlN Buffer Layer, Appl. Phys. Lett.48 (5), Feb. 3, 1986, pp. 353-355.

Shuji Nakamura, GaN Growth Using GaN Buffer Layer, Japanese Journal of Applied Physics, vol. 30, No. 10A, Oct. 1991, pp. L 1705-L1707.

Shuji Nakamura et al., Candela-class high-brightness InGaN/AlGaN double-heterostructure blue-light-emitting diodes, Appl. Phys. Lett. 64 (13) Mar. 28, 1994, pp. 1687-1689.

(Continued)

*Primary Examiner*—Kevin M Picardat
(74) *Attorney, Agent, or Firm*—Gates & Cooper LLP (57) ABSTRACT

A method for growing an improved quality device by depositing a low temperature (LT) magnesium (Mg) doped nitride semiconductor thin film. The low temperature Mg doped nitride semiconductor thin film may have a thickness greater than 50 nm. A multi quantum well (MQW) active layer may be grown at a growth temperature and the LT Mg doped nitride semiconductor thin film may deposited on the MQW active layer at a substrate temperature no greater than 150° C. above the growth temperature.

20 Claims, 5 Drawing Sheets

OTHER PUBLICATIONS

Kay Domen et al., Electron Overflow to the AlGaN p-Cladding Layer in InGaN/GaN/AlGaN MQW Laser Diodes, MRS J. Nitride Semicond. Res. 3, 2 (1998), pp. 1-5.

Hiroshi Amano et al., P-Type Conduction in Mg-Doped GaN Treated with Low-Energy Electron Beam Irradiation (LEEBI), Japanese Journal of Applied Physics, vol. 28, No. 12, Dec. 1989, pp. L2112-L2114.

Shuji Nakamura et al., Thermal Annealing Effects on P-Type Mg-Doped GaN Films, Jpn. J. Appl. Phys., vol. 31, (1992), pp. L139-L142.

Shao, Y-P. et al., "Electrical Characterization of Semipolar Gallium Nitride Thin Films," NNIN REU Research Accomplishments, Aug. 2005, pp. 132-133.

* cited by examiner

FIG. 5

METHOD FOR DEPOSITION OF MAGNESIUM DOPED (AL, IN, GA, B)N LAYERS

CROSS-REFERENCE TO RELATED APPLICATION

This application claims the benefit under 35 U.S.C. Section 119(e) of the following and commonly-assigned U.S. patent application:

U.S. Provisional Application Ser. No. 60/822,600, filed on Aug. 16, 2006, by Michael Iza, Hitoshi Sato, Steven P. Denbaars and Shuji Nakamura, entitled "METHOD FOR DEPOSITION OF MAGNESIUM DOPED (Al, In, Ga, B)N LAYERS,";

which application is incorporated by reference herein.

BACKGROUND OF THE INVENTION

1. Field of the Invention

This invention relates to a method for growing improved quality devices using low temperature magnesium doped nitride films.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The usefulness of gallium nitride (GaN), and its ternary and quaternary compounds incorporating aluminum and indium (AlGaN, InGaN, AlInGaN), has been well established for the fabrication of visible and ultraviolet optoelectronic devices and high-power electronic devices. These devices are typically grown epitaxially using growth techniques comprising molecular beam epitaxy (MBE), metalorganic chemical vapor deposition (MOCVD), and hydride vapor phase epitaxy (HVPE).

Nitride based optoelectronic devices began their quick ascent to commercialization with the advent of the use of a thin nucleation layer prior to the deposition of high quality GaN [1,2]. This technique is employed due to the lack of a native substrate available for GaN growth. More recently, techniques such as the development of p-type GaN by magnesium doping followed by high temperature annealing have also proved vital.

However, the development of indium gallium nitride (InGaN) as the active layer for short wavelength devices enabled nitride based light emitting diodes (LEDs) and laser diodes (LDs) to overtake many other research ventures. Consequently, InGaN has become the dominant material system used for visible light semiconductor applications.

Figure 1:
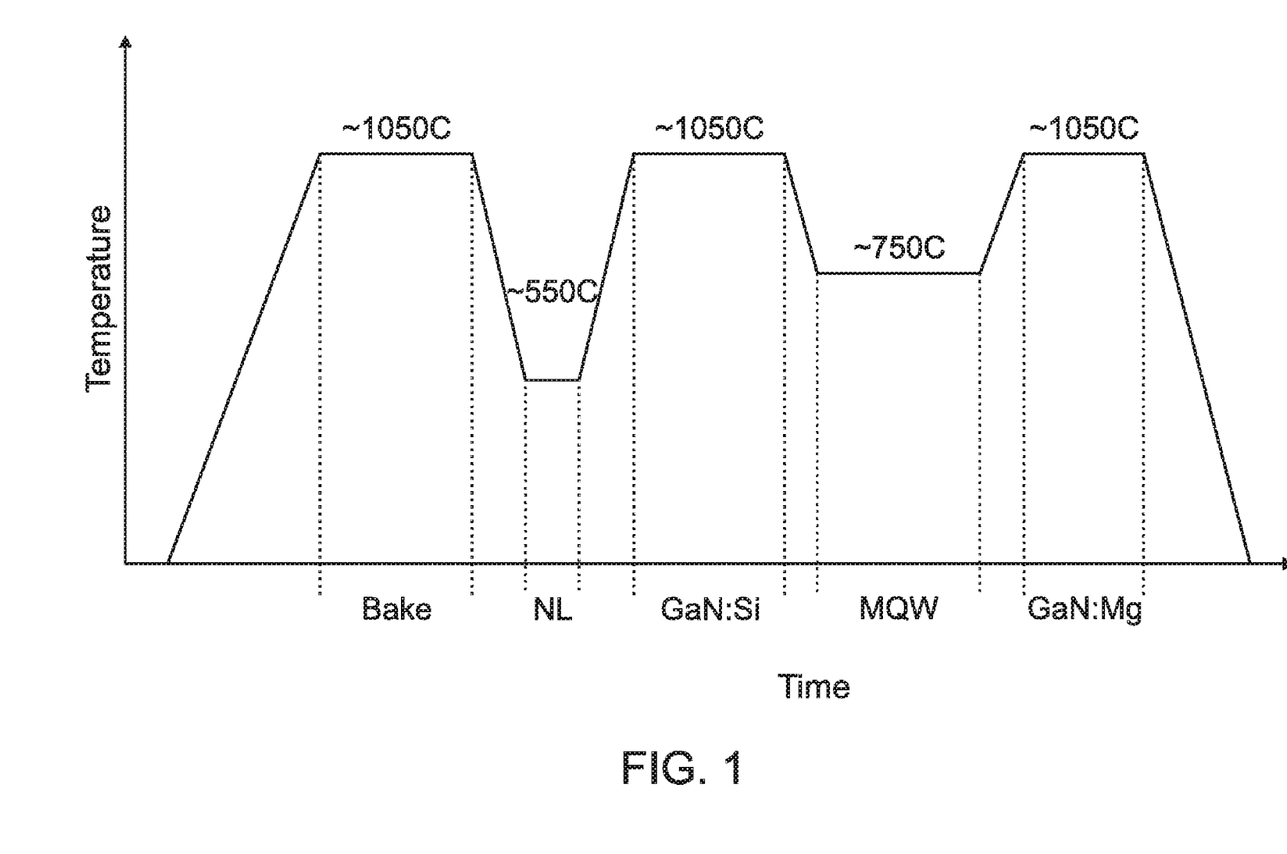
FIG. 1 shows a typical temperature profile for the deposition of a nitride based diode device containing InGaN multiple quantum wells.

FIG. 1 illustrates a typical deposition temperature profile as a function of deposition time for fabricating a nitride based diode device. Most nitride LED and LD processes using MOCVD begin by heating the substrate to a temperature of approximately 1050° C. for 5-30 minutes (referred to as the "Bake" step in FIG. 1). This initial step is believed to aid in the removal of any impurities that might be present on the surface of the sapphire ($Al_2O_3$) substrate and substrate holder.

The temperature is then lowered to between 450-700° C. to grow the low temperature GaN nucleation layer (NL) (referred to as the "NL" step in FIG. 1). Most nucleation layers are deposited to a thickness of approximately 10-50 nm.

Once a desired nucleation layer thickness is achieved, the substrate temperature is increased to approximately 1050° C. for the deposition of high quality GaN thin films (referred to as the "GaN:Si" step in FIG. 1). This GaN film can be doped with silicon (Si) to achieve n-type conductivity for the electrically negatively charged material because of the over abundance of electrically active electrons that are present.

Once the n-type GaN:Si is deposited, the substrate temperature is decreased to deposit the InGaN multiple quantum well (MQW) (referred to as the "MQW" step in FIG. 1). The use of InGaN as the active region for Nitride based semiconductors was first developed by Nakamura et al. [3]. Reference [3] manufactured an InGaN/AlGaN double heterostructure (DH) LED, and initial results showed such LEDs could produce 1 candela (cd) in brightness [3]. This structure was later modified to a multiple period InGaN/GaN quantum well, or multi quantum well (MQW), which resulted in even higher efficiencies including internal quantum efficiencies reaching an estimated 70%. It was also discovered that indium incorporation is highly dependent on the growth temperature of the film. Consequently, different indium compositions can be attained by varying the growth temperature of the InGaN film. In turn, this changes the energy gap of the active material and leads to a variation in the emission wavelength when the film is biased or excited by photoluminescence. Typical substrate temperatures for InGaN deposition range from 700-900° C. and are dependent on growth conditions and reactor geometry. Above this temperature range, indium nitride (InN) becomes volatile and easily dissociates leading to low InN incorporation in the films. Below this temperature, InN incorporation greatly increases which can lead to indium clustering and poor film quality.

While maintaining the same temperature used to grow the MQW, an AlGaN electron blocking layer is usually deposited on top of the MQW. Typical thicknesses for this layer range from 5 nm to 300 nm. The AlGaN film acts as an electron blocking layer when the LED is biased. This is due to the larger bandgap energy of the AlGaN present in the layer, wherein the AlGaN layer acts as a potential energy barrier that the electrons must overcome, thereby aiding in the confinement of the electrons to the active region of the device. This confinement increases the probability of radiative recombination in the active region of the LED [4].

The film is then heated to a substrate temperature between 1000° C. to 1100° C. in order to deposit a film of p-type GaN doped with magnesium (Mg) (referred to as the "GaN:Mg" step in FIG. 1). Typical thicknesses for the Mg doped GaN films range from 150 nm to 500 nm. Mg incorporation into GaN has been shown to act as a deep level acceptor, causing the Mg doped nitride material to have a lack of electrons which results in the film having an electrically positive behavior (p-type GaN).

For many years, it was believed that a p-type GaN film was not possible, until Amano et al [8] discovered that p-type GaN was possible by doping the GaN film with Mg. However, in order for the Mg doped GaN film to behave like a p-type material, the film had to undergo a Low-Energy Electron-Beam radiation (LEEBI) treatment after growth [5]. Nakamura et al. later discovered that a p-type film could also be obtained by annealing the Mg doped GaN film at temperatures greater than 600° C. in nitrogen ($N_2$) after growth [6,7].

Although Mg doped GaN has been extensively used in nitride based LEDs, the use comprises of GaN films grown at temperatures higher than the deposition temperature of the preceding InGaN MQWs. As mentioned previously, InN has a high volatility and readily evaporates out of the InGaN films when exposed to a high enough temperature and/or a low temperature for an extended period of time. This time and temperature value is commonly referred to as the material's thermal budget.

The present invention distinguishes itself from the above-mentioned methods by the use of a low temperature (LT) Mg doped nitride layer in order to improve the quality of diodes and devices comprising InN. As a result, there is a need for improved methods for the growth of LT Mg doped nitride planar films, wherein the thermal budget of the previously deposited InN containing MQW is considerably reduced. The present invention satisfies this need.

SUMMARY OF THE INVENTION

The present invention discloses a method for growing an improved quality device by depositing a low temperature (LT) magnesium (Mg) doped nitride semiconductor thin film. The low temperature Mg doped nitride semiconductor thin film may have a thickness greater than 50 nm. The low temperature Mg doped semiconductor thin film may comprise one or more layers of intentionally doped or unintentionally doped materials.

The method may further comprise depositing one or more Indium containing nitride based quantum well layers at a growth temperature, and depositing a nitride semiconductor film, for example, a LT Mg doped nitride semiconductor thin film, on the quantum well layers at a growth substrate temperature no greater than 150° C. above the growth temperature of the Indium containing nitride-based quantum well layers. The nitride semiconductor film may comprise one or more layers of intentionally doped or unintentionally doped materials. nitride semiconductor thin film may have a thickness greater than 50 nm.

The nitride semiconductor film may comprise multiple layers having varying or graded compositions. The nitride semiconductor film may comprise a heterostructure comprising layers of dissimilar (Al,Ga,In,B)N composition. The nitride semiconductor film may comprise GaN, AlN, InN, AlGaN, InGaN or AlInN.

The nitride semiconductor thin film may be grown in any crystallographic nitride direction, such as on a conventional c-plane oriented nitride semiconductor crystal, or on a non-polar plane such as a-plane or m-plane, or on any semipolar plane. The growth substrate temperature may be substantially equal to the growth temperature, or no greater than 50° C. above the growth temperature of the Indium containing nitride-based quantum well layers.

The nitride semiconductor film and the Indium containing nitride-based quantum well layers may be grown by hydride vapor phase epitaxy (HVPE), metalorganic chemical vapor deposition (MOCVD), or molecular beam epitaxy (MBE).

The present invention further discloses a device having enhanced output power. For example, the device may be a light emitting diode (LED), comprising one or more Indium containing nitride-based quantum well layers, an n-type layer deposited on one side of the Indium containing nitride-based quantum well layers for injecting n-type carriers into the Indium containing nitride-based quantum well layers, and a nitride semiconductor layer, containing Mg, deposited on the Indium containing nitride-based quantum well layers for acting as a p-type layer, wherein the nitride semiconductor layer has a thickness of at least 50 nm.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a method for growing device-quality, planar LT Mg doped nitride semiconductor thin films via MOCVD. Growth of LT Mg doped nitride semiconductor layers offers a means of improving device characteristics in III-nitride structures. The term nitrides refers to any alloy composition of the (Ga,Al,In,B)N semiconductors having the formula $Ga_nAl_xIn_yB_zN$ where:

$$0 \le n \le 1, 0 \le x \le 1, 0 \le y \le 1, 0 \le z \le 1, \text{ and } n+x+y+z=1.$$

Current nitride devices, such as LEDs and LDs, comprise a high temperature grown (Al,In,Ga,B)N Mg doped layer. The high temperature Mg doped layer deposition results in a drastic degradation in device performance such as device output power. Growth of LT Mg doped (Al,In,Ga,B)N layers could improve device performance by greatly minimizing the thermal budget exerted on the previously deposited (Al,In,Ga,B)N films. The present invention provides a means of enhancing (Al,In,Ga,B)N device performance by use of LT Mg doped layers grown by MOCVD.

Technical Description

The present invention describes a method for growing device-quality planar LT Mg doped nitride semiconductor thin films via MOCVD. Growth of LT Mg doped nitride semiconductor layers offers a means of improving device characteristics in III-nitride structures. These films were grown using a commercially available MOCVD system. General growth parameters for LT Mg doped GaN growth comprise a pressure between 10 torr and 1000 torr and a temperature less than 150° C. above the MQW temperature. The epitaxial relationships and conditions should hold true regardless of the type of reactor used. However, the reactor conditions for growing LT Mg doped GaN will vary according to individual reactors and growth methods (HVPE, MOCVD, and MBE, for example).

Using this method, the InGaN's thermal budget can be greatly decreased by growing the Mg doped GaN film at a temperature less than or equal to that used to grow the MQW. By reducing the deposition temperature of the Mg doped GaN film grown after the diode's MQW, which typically contains 1-20% InN in GaN, it is possible to reduce the thermal damage to the MQW material. This greatly increases the MQW's quality by maintaining sharp heterojunction interfaces and decreasing InN segregation and clustering.

The method for growing a nitride film according the present invention generally comprises the following steps:

(1) Loading the substrate into an MOCVD reactor.

(2) Turning on a heater for the reactor and ramping a temperature in the reactor to a set point temperature, wherein nitrogen and/or hydrogen and/or ammonia flow over the substrate at atmospheric pressure.

(3) After a period of time, decreasing the set point temperature and introducing trimethylgallium (TMGa) and ammonia into the reactor to initiate growth of the GaN nucleation or buffer layer.

(4) After the GaN nucleation layer reaches a desired thickness, shutting off the flow of TMGa and increasing the reactor temperature to a set point.

(5) After the reactor set point temperature is achieved, turning on the flow of TMGa and DiSilane ($Si_2H_6$) for the growth of n-type GaN doped with silicon.

(6) Once a desired thickness is achieved for the n-type GaN, the temperature set point is decreased for the deposition of the InGaN MQW.

(7) After the set point temperature is achieved, turning on a flow of trimethylindium (TMIn) and TMGa for the deposition of the InGaN MQW.

(8) Once a desired thickness is achieved for the MQW, the TMIn flow is shut off and the flow of trimethylaluminium (TMAl) is opened for the deposition of an AlGaN film.

(9) After the AlGaN electron blocking layer reaches a desired thickness, shutting off the flow of TMAl, and introducing Bis(cyclopentadienyl)magnesium ($Cp_2Mg$) for the deposition of LT Mg doped GaN.

(10) After the LT Mg doped GaN reaches a desired thickness, shutting off the flow of TMGa and $Cp_2Mg$, and cooling the reactor down while flowing ammonia to preserve the planar nitride semiconductor thin films.

The present invention is intended to cover a device fabricated using these steps. The LT Mg doped planar nitride semiconductor thin film may comprise of GaN, AlN, InN, AlGaN, InGaN or AlInN, for example. Moreover, the LT Mg doped planar nitride semiconductor thin film may comprise multiple layers having varying or graded compositions. In addition, the LT Mg doped planar nitride semiconductor thin film may comprise a heterostructure containing layers of dissimilar (Al,Ga,In,B)N composition.

Process Steps

Figure 2:
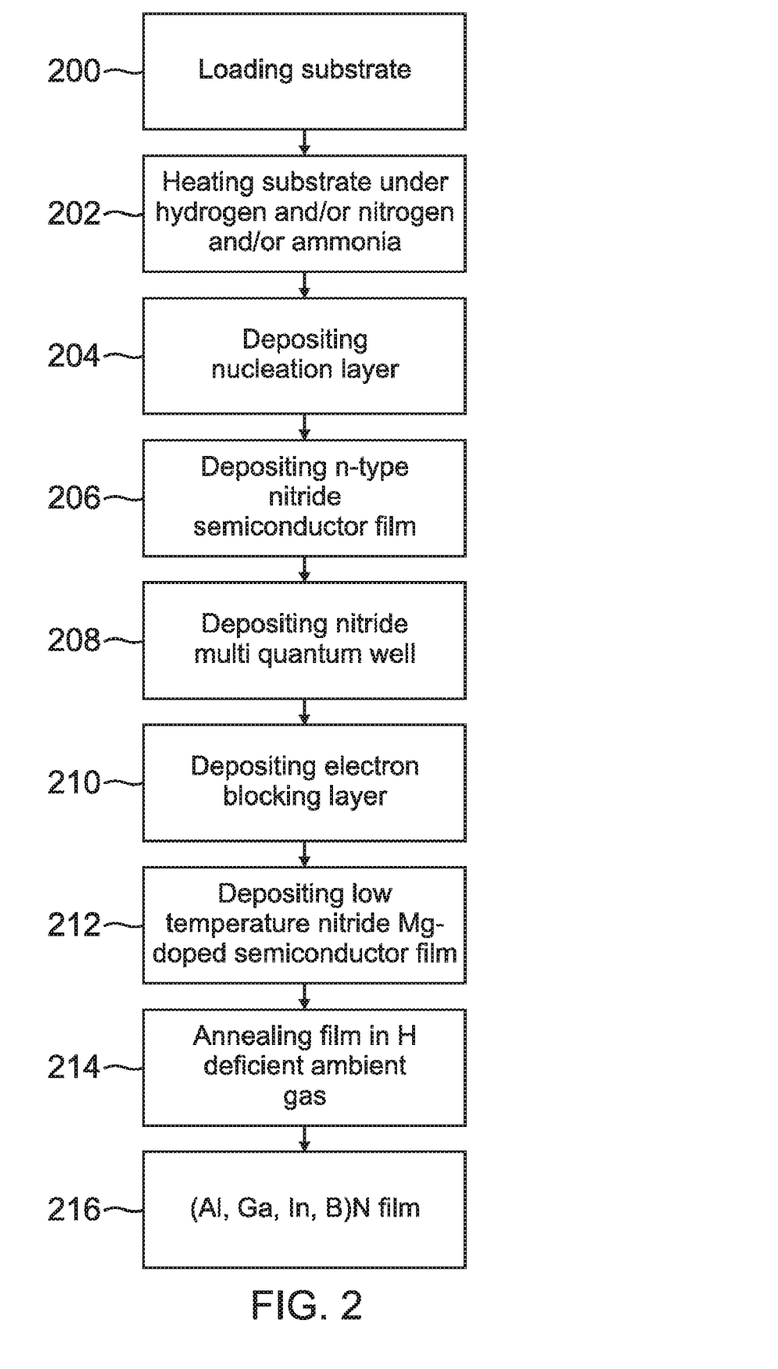
FIG. 2 is a flow chart of the method for growing a Mg-doped nitride film according to the preferred embodiment of this invention.

FIG. 2 is a flowchart that illustrates the steps for the growth of LT Mg doped gallium nitride (GaN) thin films using MOCVD, according to the preferred embodiment of the present invention that is described in the following paragraphs.

Block 200 represents the step of loading a substrate, wherein a sapphire (0001) substrate may be loaded into an MOCVD reactor.

Block 202 represents the step of heating the substrate under hydrogen and/or nitrogen and/or ammonia flow. During this step, the reactor's heater is turned on and ramped to a set point temperature of 1150° C. under hydrogen and/or nitrogen and/or ammonia flow. Generally, nitrogen and/or hydrogen flow over the substrate at atmospheric pressure.

Block 204 represents the step of depositing a nucleation layer. During this step, twenty minutes after ramping to the set point temperature of Block 202, the reactor's set point temperature is decreased to 570° C. and 3 sccm of TMGa is introduced into the reactor to initiate the GaN nucleation or buffer layer growth. After 100 seconds, the GaN nucleation or buffer layer reaches the desired thickness. At this point, the TMGa flow is shut off and the reactor's temperature is increased to 1185° C.

Block 206 represents the step of depositing an n-type nitride semiconductor film. During this step, once the set point temperature of block 204 is reached, 15 sccm of TMGa may be introduced into the reactor to initiate the GaN growth for 15 minutes. Once the desired GaN thickness is achieved, 4 sccm of $Si_2H_6$ is introduced into the reactor to initiate the growth of n-type GaN doped with silicon for 45 minutes.

Block 208 represents the step of depositing one or more nitride based active layers on a substrate at a growth temperature. The active layers may be, for example, one or more quantum wells or multi quantum wells, and preferably contain Indium (In), for example, 1-20% InN in GaN. During this step, once the desired n-type GaN thickness of Block 206 is achieved, the reactor's temperature set point is decreased to 880° C., and 30 sccm of TEGa is introduced into the reactor for 200 seconds to initiate the deposition of the GaN barrier layer. Once the desired thickness of the GaN barrier layer is achieved, 70 sccm of TMIn is introduced into the reactor for 24 seconds and then shut off, to initiate the deposition of the InGaN quantum well layer. These two preceding steps (GaN barrier and InGaN quantum well deposition) are then repeated five times. After the last InGaN quantum well layer is deposited, 30 sccm of TEGa is introduced into the reactor for 160 seconds for growth of GaN and then shut off.

Block 210 represents the step of depositing an electron blocking layer. During this step, once the MQW of Block 208 is deposited, 1 sccm of TMGa and 1 sccm of TMAl are introduced into the reactor for 100 seconds and then shut off, for the deposition of the AlGaN electron blocking layer.

Block 212 represents the step of depositing a nitride semiconductor film on the active layers at a substrate temperature no greater than 150° C. or 50° C. above the growth temperature, wherein the nitride semiconductor film preferably comprises an LT nitride semiconductor film doped with Mg. During this step, once the desired AlGaN thickness of Block 210 is achieved, the reactor's set point temperature is maintained at 880° C. and 3.5 sccm of TMGa and 50 sccm of Bis(cyclopentadienyl)magnesium ($Cp_2Mg$) is introduced into the reactor for 12 minutes and then shut off, for the deposition of LT Mg doped GaN. Once a desired LT Mg doped GaN thickness is achieved, the reactor is cooled down while flowing ammonia to preserve the GaN film.

Block 214 represents the step of annealing the film in a hydrogen (H) deficient atmosphere. During this step, once the reactor has cooled in Block 212, the nitride diode is removed and annealed in a hydrogen deficient atmosphere for 15 minutes at a temperature of 700° C. in order to activate the LT Mg doped GaN.

Block 216 represents the end result of the method, for example, a device having enhanced output power. In the preferred embodiment, the device is a nitride-based LED or Laser Diode (LD) including LT Mg doped GaN. For example, the device may be an LED comprising one or more Indium containing nitride-based quantum well layers, an n-type layer deposited on one side of the Indium containing nitride-based quantum well layers for injecting n-type carriers into the Indium containing nitride-based quantum well layers, and a nitride semiconductor layer, containing Mg, deposited on the Indium containing nitride-based quantum well layers for acting as a p-type layer, wherein the nitride semiconductor layer has a thickness of at least 50 nm.

Note that steps may be omitted or added as desired. For example, Blocks 204 and 210 maybe omitted as desired.

Advantages and Improvements

Figure 3:
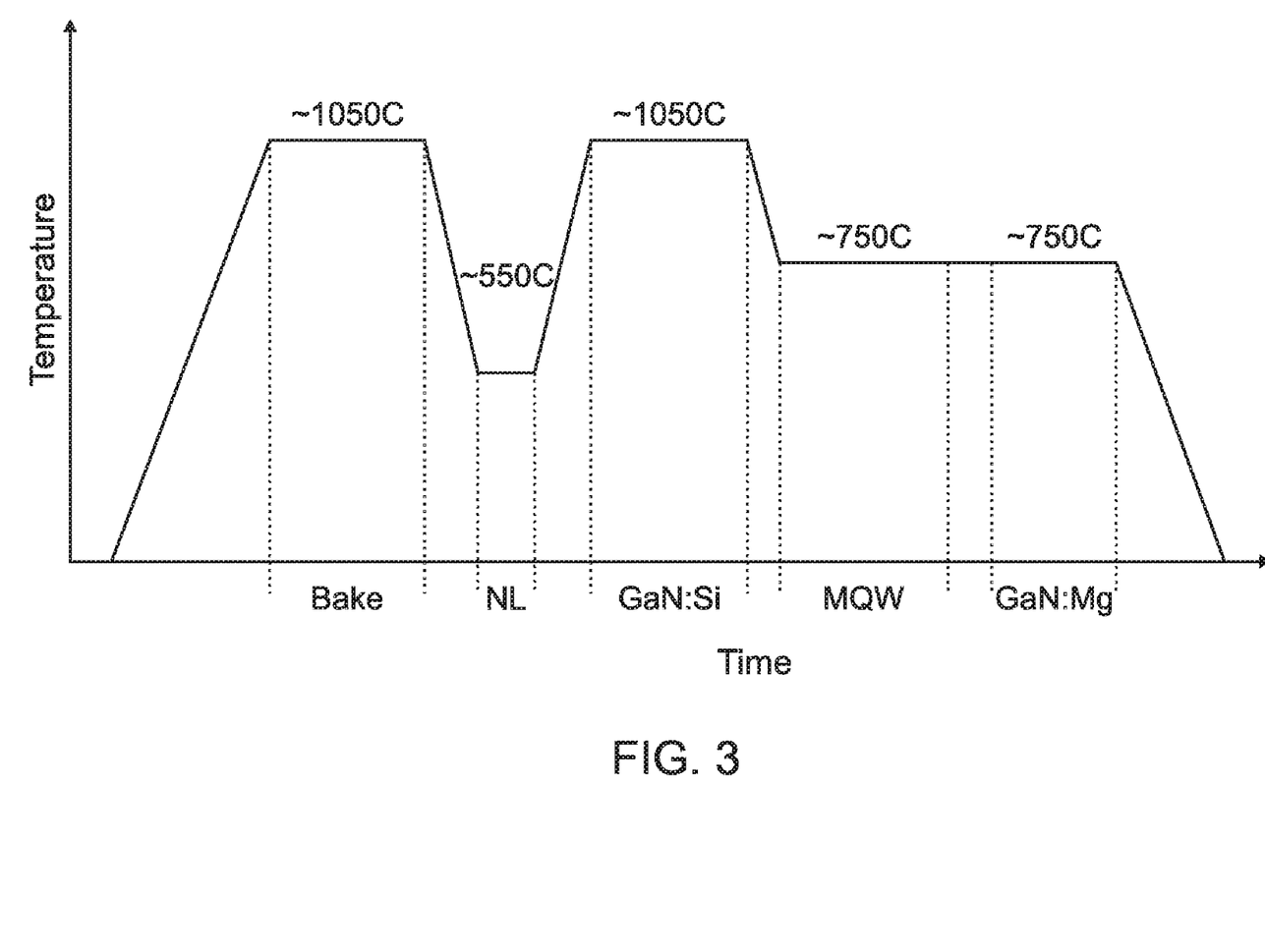
FIG. 3 shows the temperature profile for the deposition of a nitride based diode device comprising InGaN multiple quantum wells, according to the preferred embodiment of this invention.

FIG. 3 shows the deposition temperature profile as a function of deposition time for the preferred embodiment of this invention.

Most nitride LED and LD processes using MOCVD begin by heating the substrate to a temperature of approximately 1050° C. (referred to as the "Bake" step in FIG. 3). The temperature may then be lowered to between 450-700° C. to grow the low temperature GaN nucleation layer (referred to as the "NL" step in FIG. 3). Once a desired nucleation layer (NL) thickness is achieved, the substrate temperature may be increased to approximately 1050° C. for the deposition of high quality GaN thin films (referred to as the "GaN:Si" step in FIG. 3). Once the n-type GaN:Si is deposited, the substrate temperature may be decreased to deposit the InGaN multiple quantum well (MQW) (referred to as the "MQW" step in FIG. 3). Typical substrate temperatures for InGaN deposition range from 700-900° C. and are dependent on growth conditions and reactor geometry. While maintaining the same temperature used to grow the MQW, an AlGaN electron blocking layer is optionally deposited on top of the MQW. Then, a LT film of p-type GaN doped with Mg may be deposited (referred to as the "GaN:Mg" step in FIG. 3).

As shown in FIG. 3, the temperature for growth of the Mg doped GaN film (the "GaN:Mg" step in FIG. 3) is the same as the temperature for the growth of the MQW that was previously deposited in the "MQW" step of FIG. 3. The LT Mg doped GaN deposition temperature is drastically different in comparison to what is used in current nitride technology.

Current nitride technology relies on using a Mg doped GaN deposition temperature much higher than the temperature used to grow the MQW. As mentioned previously, the InGaN's thermal budget can be greatly decreased by growing the Mg doped GaN film at a temperature less than or equal to the temperature used to grow the MQW. Thus, by reducing the deposition temperature of the Mg doped GaN doped film after growing the diode's MQW, which typically contains 1-20% InN in GaN, it is possible to reduce thermal damage to the MQW material. This greatly increases the MQW's quality by maintaining sharp heterojunction interfaces and decreasing InN segregation and clustering.

Figure 4:
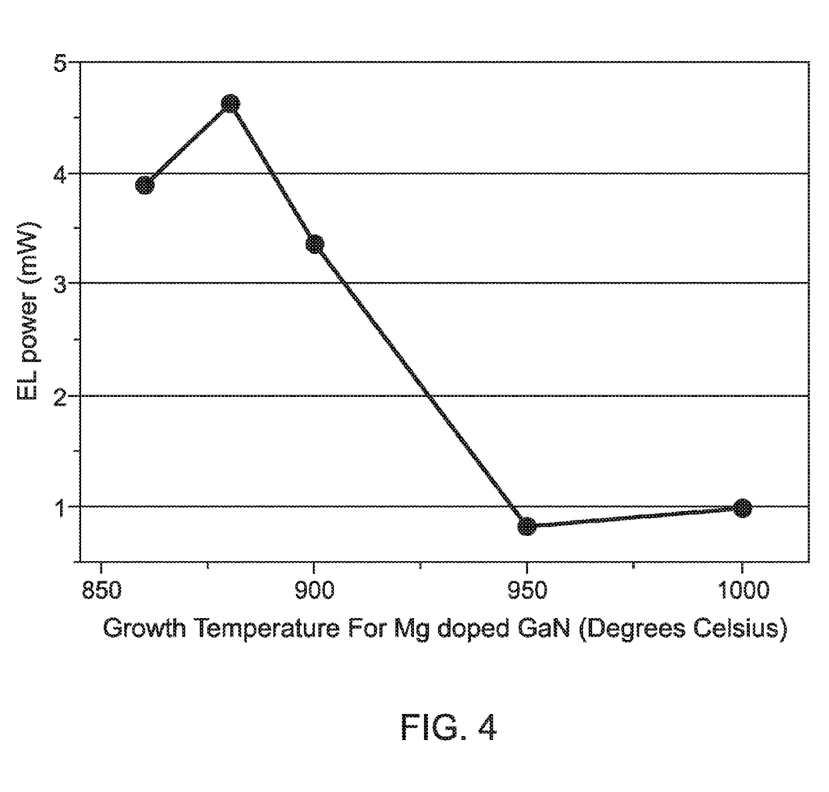
FIG. 4 shows LED output power as a function of the Mg doped GaN growth temperature.

FIG. 4 shows the measured dependence of LEDs' output power on Mg doped GaN deposition temperature. The output power of the LEDs was evaluated by measuring the light output using a silicon photo detector through the back of the substrate. This is commonly referred to as an "on-wafer" measurement. It is important to note that the MQW deposition temperature for all the LEDs in FIG. 4 was 880° C. It is clear from the FIG. 4 data that using a deposition temperature for the Mg doped GaN similar to the deposition temperature for the MQW can drastically improve the output power of the LED. The maximum output power was observed for a LT Mg doped deposition temperature of 880° C. In contrast, the output power of the LEDs is significantly reduced with a Mg doped GaN deposition temperature greater than the MQW deposition temperature (880° C.), with the lowest output power measured for a LT Mg doped deposition temperature of 950° C. It may be concluded that using an LT Mg doped GaN deposition temperature, as described in the preferred embodiment of this invention, offers a means of appreciably increasing the output power of a nitride LED.

Figure 5:
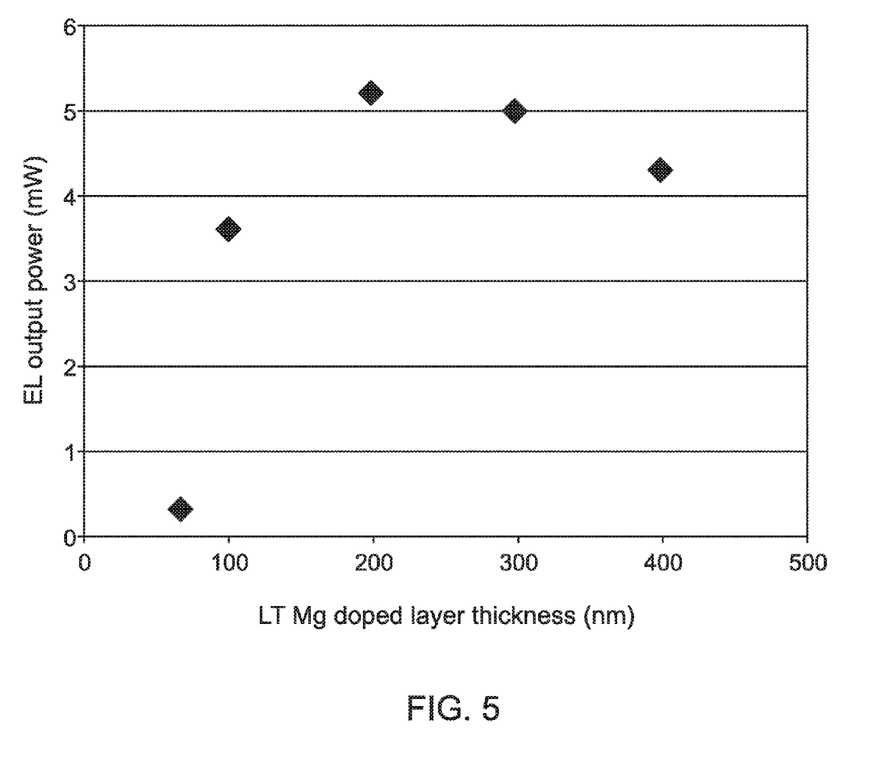
FIG. 5 shows the dependence of LED output power on the Mg doped GaN thickness.

FIG. 5 describes the measured output power, or electroluminescence (EL), of LEDs as a function of LT Mg doped GaN thickness. It can be seen that in order to increase the power output of an LED, the thickness of the LT Mg doped GaN needs to exceed 50 nm. In addition, employing the use of a LT Mg doped GaN layer which has a thickness greater than 100 nm can significantly improve the power output even further. Current nitride diode technology sometimes employs a thin (typically 5-30 nm thick) low temperature GaN film doped with Mg before deposition of a higher temperature Mg doped GaN film in order to minimize damage to the MQW. However, this method differs greatly from the invention described in the preferred embodiment. The preferred embodiment of this invention uses a thick low temperature GaN film, with a minimum thickness of 50 nm, doped with Mg. It is also important to note that even unintentionally doped materials sometimes contain Mg atoms and cause p-type behavior because of the diffusion of Mg atoms. Therefore, this invention also may also comprise using unintentionally doped nitride materials.

Possible Modifications and Variations

Referring again to FIG. 3, in various embodiments of the present invention, the nitride semiconductor film may comprise GaN, AlN, InN, AlGaN, InGaN or AlInN. Moreover, the nitride semiconductor film may be a heterostructure comprising layers of dissimilar (Al,Ga,In,B)N composition.

Both the nitride semiconductor film and the active layer may be grown in any crystallographic nitride direction, such as on a conventional c-plane oriented nitride semiconductor crystal, or on a nonpolar plane such as a-plane or m-plane, or on any semipolar plane.

As noted above, the nitride semiconductor film may be doped with Mg. However, in alternative embodiments, the nitride semiconductor film may include one or more layers of intentionally doped or unintentionally doped materials.

In the preferred embodiment, the nitride semiconductor film is a substantially planar film having a thickness preferably greater than 50 nm and more preferably greater than 100 nm, although other thicknesses may be used.

In alternative embodiments, the nitride semiconductor film may be comprised of multiple layers having varying or graded compositions.

The substrate temperature may be substantially equal to the growth temperature and the growth temperature may be 880° C.

The process steps may comprise, and the nitride semiconductor film and active layers may be grown using, for example, HVPE, MOCVD or MBE.

As noted above, the final result of the method, for example, is a device having enhanced output power. The device may be an LED, for example, comprising: one or more nitride active layers containing indium, an n-type layer on one side of the active layers for injecting n-type carriers into the active layers, and a nitride semiconductor layer, containing Mg and on the active layers, acting as a p-type layer. The LED may have an output power of at least 5 milliwatts.

REFERENCES

The following references are incorporated by reference herein:

[1] H. Amano, N. Sawaki, I. Akasaki, and Y. Toyoda, Appl. Phys. Lett. 48, 353 (1986).

[2] S, Nakamura, Jpn. J. Appl. Phys. 30, L1705 (1991).

[3] S, Nakamura, T. Mukai, and M. Senoh, Appl. Phys. Lett. 64, 1687 (1994).

[4] K. Domen, R. Soejima, A. Kuramata, and T. Tanahashi, MRS Internet J. Nitride Semicond. Res. 3, 2 (1998).

[5] H. Amano, M. Kito, K. Hiramatsu, and I. Akasaki, Jpn. J. Appl. Phys. 28, L2112 (1989).

[6] S, Nakamura, T. Mukai, M. Senoh, and N. Twasa, Jpn. J. Appl. Phys. 31, L139 (1992).

[7] U.S. Pat. No. 5,306,662, issued on Apr. 26, 1994, to S. Nakamura et al., entitled "Method of manufacturing P-type compound semiconductor."

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for growing an improved quality device, comprising:
   (a) depositing one or more Indium (In) containing nitride-based quantum well layers at a growth temperature; and
   (b) depositing a nitride semiconductor film on the quantum well layers at a growth substrate temperature no greater than 150° C. above the growth temperature of the Indium containing nitride-based quantum well layers, wherein the growth substrate temperature reduces thermal damage to the quantum well layers and the nitride semiconductor film has a thickness greater than 50 nm.

2. The method of claim 1, wherein the nitride semiconductor film is doped with Magnesium (Mg).

3. The method of claim 1, wherein the nitride semiconductor film comprises one or more layers of intentionally doped or unintentionally doped materials.

4. The method of claim 1, wherein the nitride semiconductor film comprises multiple layers having varying or graded compositions.

5. The method of claim 1, wherein the nitride semiconductor film comprises a heterostructure comprising layers of dissimilar (Al,Ga,In,B)N composition.

6. The method of claim 1, wherein the nitride semiconductor film comprises GaN, AlN, InN, AlGaN, InGaN or AlInN.

7. The method of claim 1, wherein the nitride semiconductor film is grown in any crystallographic nitride direction, such as on a conventional c-plane oriented nitride semiconductor crystal, or on a nonpolar plane, or on any semipolar plane.

8. The method of claim 1, wherein the growth substrate temperature is substantially equal to the growth temperature.

9. The method of claim 1, wherein the growth substrate temperature is no greater than 50° C. above the growth temperature of the Indium containing nitride-based quantum well layers.

10. The method of claim 1, wherein the nitride semiconductor film and the Indium containing nitride-based quantum well layers are grown by hydride vapor phase epitaxy (HVPE), metalorganic chemical vapor deposition (MOCVD), or molecular beam epitaxy (MBE).

11. A device having enhanced output power fabricated using the method of claim 1.

12. The method of claim 1, further comprising performing steps (a) and (b) in sequence, wherein the quantum wells are multi quantum wells grown at the growth temperature.

13. The method of claim 1, wherein the nitride semiconductor film comprises GaN.

14. A light emitting diode (LED), comprising:
   (a) one or more Indium (In) containing nitride-based quantum well layers;
   (b) an n-type layer deposited on one side of the Indium containing nitride-based quantum well layers for injecting n-type carriers into the Indium containing nitride-based quantum well layers; and
   (c) a nitride semiconductor layer, containing Magnesium (Mg), deposited on the Indium containing nitride-based quantum well layers for acting as a p-type layer, wherein the nitride semiconductor layer has a thickness of at least 50 nm and the nitride semiconductor layer is deposited at a growth substrate temperature no greater than 150° C. above a growth temperature of the Indium containing nitride-based quantum well layers to reduce thermal damage to the quantum well layers.

15. The LED of claim 14, wherein the nitride semiconductor layer comprises GaN, AlN, InN, AlGaN, InGaN or AlInN.

16. The LED of claim 14, wherein the nitride semiconductor layer comprises GaN.

17. The LED of claim 14, wherein the nitride semiconductor layer comprises multiple layers having varying or graded compositions.

18. The LED of claim 14, wherein the nitride semiconductor layer comprises a heterostructure comprising layers of dissimilar (Al,Ga,In,B)N composition.

19. The LED of claim 14, wherein the nitride semiconductor layer is grown on a nonpolar plane or on any semipolar plane.

20. The LED of claim 14, wherein the quantum wells are multi quantum wells grown at the growth temperature and the nitride semiconductor layer is grown directly on, and in contact with, an (Al,In,Ga,B)N layer.

* * * * *